United States Patent
Apodaca et al.

(10) Patent No.: US 9,450,182 B2
(45) Date of Patent: Sep. 20, 2016

(54) SELF-ALIGNED MEMORY CELL CONTACT

(71) Applicant: HGST, Inc., San Jose, CA (US)

(72) Inventors: Mac D. Apodaca, San Jose, CA (US);
Daniel R. Shepard, North Hampton, NH (US)

(73) Assignee: HGST, Inc., San Jose, CA (US)

( * ) Notice: Subject to any disclaimer, the term of this patent is extended or adjusted under 35 U.S.C. 154(b) by 0 days.

(21) Appl. No.: 14/794,762

(22) Filed: Jul. 8, 2015

(65) Prior Publication Data
US 2016/0020391 A1   Jan. 21, 2016

Related U.S. Application Data

(60) Provisional application No. 62/022,289, filed on Jul. 9, 2014.

(51) Int. Cl.
*H01L 21/00* (2006.01)
*H01L 45/00* (2006.01)
*G11C 13/00* (2006.01)
*H01L 27/24* (2006.01)

(52) U.S. Cl.
CPC ....... *H01L 45/1253* (2013.01); *G11C 13/0004* (2013.01); *G11C 13/0069* (2013.01); *H01L 27/2409* (2013.01); *H01L 27/2427* (2013.01); *H01L 45/06* (2013.01); *H01L 45/124* (2013.01); *H01L 45/1246* (2013.01); *H01L 45/144* (2013.01); *H01L 45/1675* (2013.01); *G11C 2013/0078* (2013.01)

(58) Field of Classification Search
CPC . H01L 45/1253; H01L 45/124; H01L 45/06; H01L 45/1246
See application file for complete search history.

(56) References Cited

U.S. PATENT DOCUMENTS

2009/0309154 A1* 12/2009 Cho ................. H01L 27/11524
257/324
2011/0275197 A1* 11/2011 Park ................. H01L 27/10852
438/478

\* cited by examiner

*Primary Examiner* — Richard Booth
(74) *Attorney, Agent, or Firm* — Patterson & Sheridan, LLP (57) ABSTRACT

In various embodiments, a memory storage element for storing two or more bits of information is formed by connecting two resistive change elements in series whereby the first resistive change element is made of a first material and the second resistive change element is made of a second material and the melting point of the first resistive change element material is greater than the melting point of the second resistive change element material such that the set and reset states of the two elements can be written and read.

20 Claims, 6 Drawing Sheets

SELF-ALIGNED MEMORY CELL CONTACT

CROSS-REFERENCE TO RELATED APPLICATIONS

This application claims benefit of U.S. Provisional Patent Application Ser. No. 62/022,289, filed Jul. 9, 2014, which is herein incorporated by reference.

This application makes reference to U.S. patent application Ser. No. 13/373,205, filed on Nov. 8, 2011 and titled "PINCHED CENTER RESISTIVE CHANGE MEMORY CELL" and this application is incorporated hereby by reference in its entirety.

TECHNICAL FIELD

Embodiments of the present invention relate to the structure and operation of memory cell, and more particularly to memory cells having an information storage element with a self-aligned bottom contact.

BACKGROUND

Today's high capacity memory devices have been made possible by fabricating highly dense arrays of conductors and components. In the case of memory devices, higher-capacity storage requires finer conductors and spacing. These conductors and components are typically fabricated by using photolithographic techniques. As the demand for higher capacity in memory devices increases, however, the need to form even finer features rises.

In an effort to reduce the cost and increase the capacity of memory devices, engineers have implemented techniques for storing more than one binary bit in a single memory cell. These multiple bits are stored as intermediate levels within the cell. In the case of a flash memory cell, a range of voltages can be stored to represent the plurality of bit states. In the case of a phase change memory, a range of resistances can be stored to represent the plurality of bit states. Capacitive memories can store a range of capacitance values. Most any type of memory cell can be adapted to store a plurality of states by storing intermediate levels as appropriate for that storage cell technology. This is well known to those skilled in the arts. One of the problems with multi-bit memory cells is that the range of levels corresponding to the various states can suffer from spreading and ultimately of overlapping levels which can result in lost data. A resistance-change material such as a phase-change material (including a chalcogenide in which the programmed resistivity can be one or two resistance values and, in the case of more than one bit per cell storage cells, in which the programmed resistivity can be one of three or more resistance values) can be altered electronically to cause heating to change the element's resistance and store one of a plurality of states.

What is needed is a memory cell that can store two or more bits of data but which enjoys the stability of a single bit per cell memory cell. The present invention fills this need by stacking two physical memory elements in a single cross-point array bit location where each of the two stacked elements are set of reset to store information thereby avoiding the condition where an intermediate level could drift to an adjacent state. An extension of the present invention would allow for intermediate levels to be stored for even more bits at a given memory cell location.

SUMMARY

Embodiments of the present invention include any two terminal storage elements that can be formed in series with a switch element in a cross point array such as a diode.

The present invention is a way to construct a memory element that can hold more than two or more bits of information.

These and other objects, along with advantages and features of the present invention herein disclosed, will become more apparent through reference to the following description, the accompanying drawings, and the claims.

BRIEF DESCRIPTION OF THE DRAWINGS

In the following description, various embodiments of the present invention are described with reference to the following drawings, in which.

DETAILED DESCRIPTION

It is known to those skilled in the art that different memory element materials (R-RAM, PRAM, Memristors, etc.) are reset using different levels of current or voltage and that within a particular type of memory element material, different chemical compositions will require different levels of current or voltage for set and reset. For example, a phase-change memory element made of Chalcogenide material such as GST-172 will require 5 to 10 times greater current to set and reset that element than is required to set and reset GST-433. Exploiting this difference in operating current is at the heart of the present invention.

Figure 1:
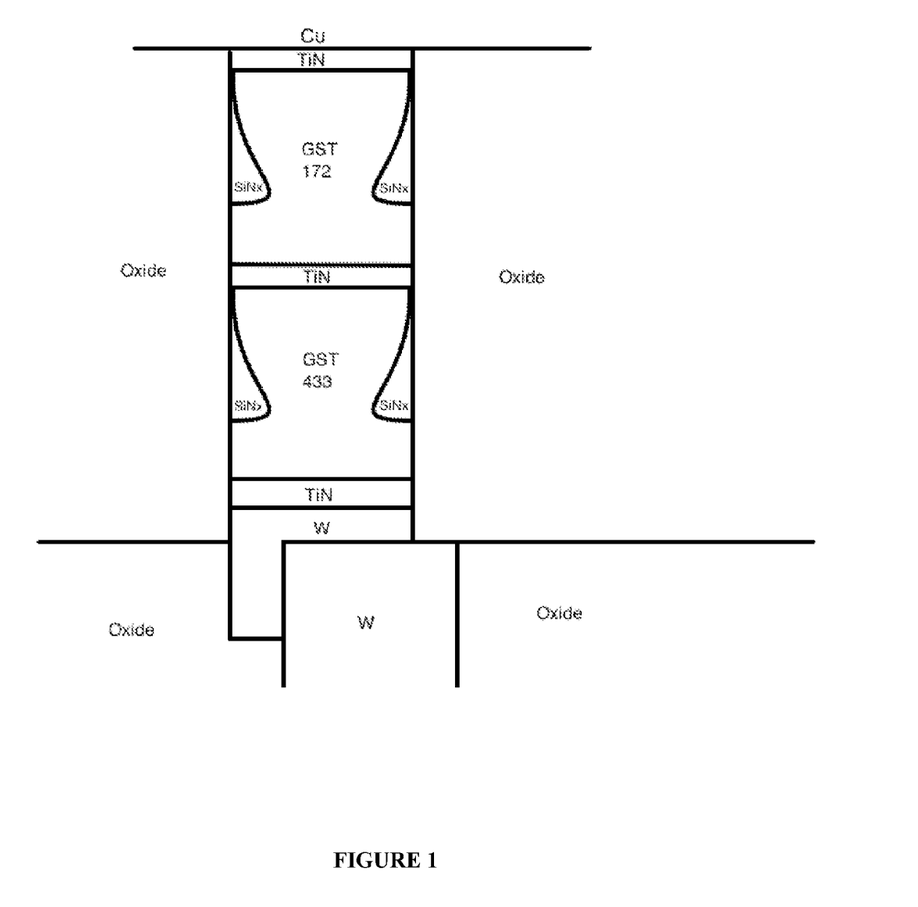
FIG. 1 depicts a dual-bit memory element according to the present invention.

Embodiments of the present invention include stacking two physical memory elements in a single cross-point array bit location where each of the two stacked elements are set of reset to store information thereby avoiding the condition where an intermediate level could drift to an adjacent state. FIG. 1 depicts a memory cell constructed according to the present invention. In such a memory cell, different materials are utilized in each physical memory element. In FIG. 1, as an example, two Phase-change memory elements (Chalcogenide elements consisting of GST-172 on top and GST-433 on the bottom) are used to build the cell.

The memory cell in FIG. 1 is constructed on a surface in which a cross-point array of diode select devices in a field of oxide has already been constructed. These diodes will have a top contact made of a conductive material such as tungsten (W). On top of this surface, a layer of dielectric (such as oxide or nitride) is deposited and holes are etched such that there is one hole on top of every memory cell aligned to the diode top contact. Some misalignment (as is depicted in FIG. 1) is permissible. These holes are first filled with conductive material (e.g., tungsten, W) and then etched back so as to leave a small amount in the bottom of the hole to facilitate a good electric to the top contact of the diode, particularly when the hole is slightly misaligned to the diode (as depicted in FIG. 1). This approach has the additional advantage when fabricating a cross-point array that the diodes in the cross-point array are identical to any diodes formed in the periphery thereby potentially eliminating any photo mask used to differentiate between diodes in the periphery and the diodes having a stacked memory element.

Once the holes are filled with the bottom conductor to create a good electrical contact with the diode top contact, a layer of barrier and/or adhesion bacterial (e.g., a barrier and/or adhesion and/or conductive material such as Ti or TiN) can be deposited and etched back (as was done to form the bottom conductor for a good electrical contact) to leave a small layer in the bottom of the holes. This deposition and etch back sequence is repeated to fill the hole with bottom GST material (GST 433), between-element barrier material (such as TiN), top GST material (GST 172), and top contact (e.g., a barrier and/or adhesion and/or conductive material such as TiN) which could alternately be formed through deposition and finished with a CMP step instead of an etch. From this point, a top dielectric layer would be deposited and then metal wordlines formed by, for example, a copper damascene process to complete the array. The cell depicted in FIG. 1 also has narrowing spacers in the centers of the GST elements which are formed according to the invention described in U.S. patent application Ser. No. 13/373,305, filed on Nov. 8, 2011 and titled "PINCHED CENTER RESISTIVE CHANGE MEMORY CELL."

Separately programming the memory elements is accomplished by taking advantage of the different currents required to melt or anneal the two memory elements due to the difference in melting temperatures of the two elements' materials. For example, a GST element having a 50 nm diameter and a narrowing to about 20 nm at the neck due to a reducing spacer (as shown in FIG. 1) will require a pulse of current of at least 500 µA to 800 µA with a fast trailing edge for reset. The fast trailing edge is required to quench the heating quickly enough to trap the GST in a higher resistance, amorphous state (as is known to those skilled in the art). Setting GST-172 is accomplished by ramping the trailing edge over an interval of about 500 nSec. The slow switching off of the current results in a slow reduction of heat in the cell resulting in annealing the GST into a lower resistance, crystalline state (as is known to those skilled in the art). This set pulse trailing edge ramp can be truncated once the amplitude reaches 10% to 20% of the initial amplitude because at this point, the annealing will be mostly completed (as is known to those skilled in the art). On the other hand, a similarly sized element of GST-433 will require a pulse of current of 90 µA with a fast trailing edge for reset or a slow trailing edge for set.

Figure 2:
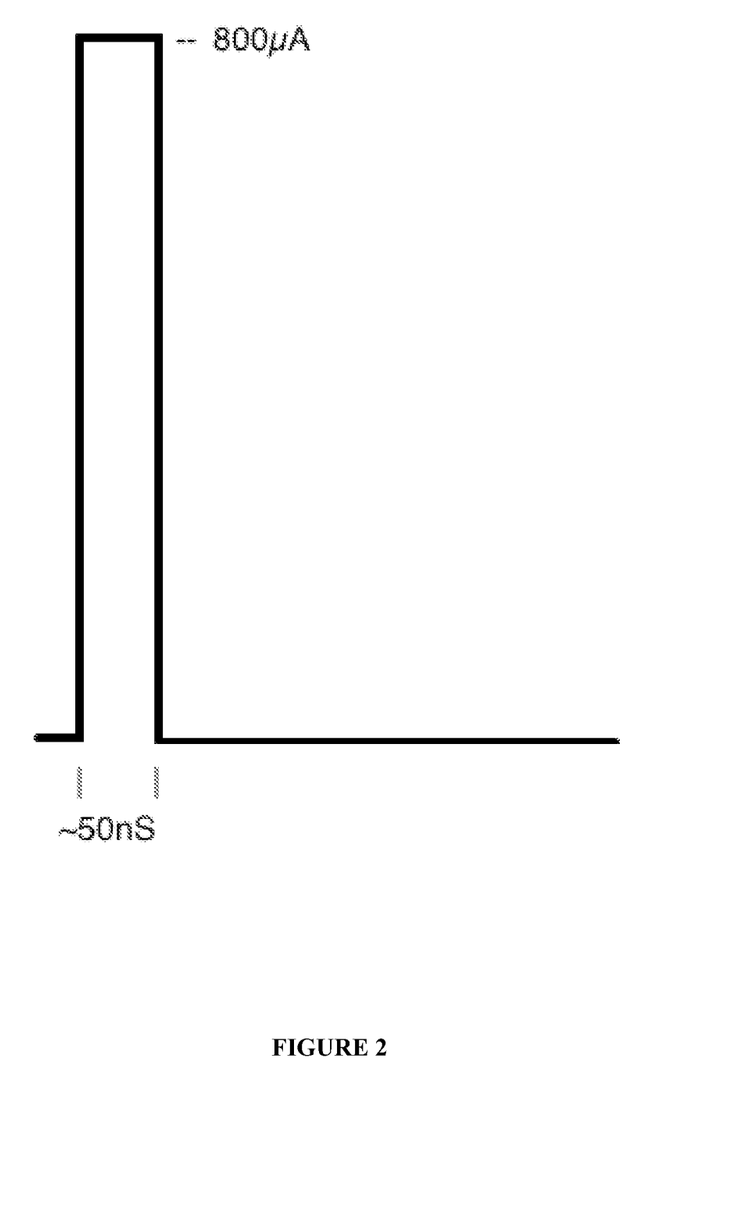
FIG. 2 illustrates a plot of current (on the y-axis) over time (y-axis) for resetting both bits of dual-bit memory element according to the present invention.

FIG. 2 depicts a current pulse for resetting both bits of dual-bit memory element according to the present invention. The high amplitude will melt both storage elements and the rapid cutoff will quench both bits into their amorphous states.

Figure 3:
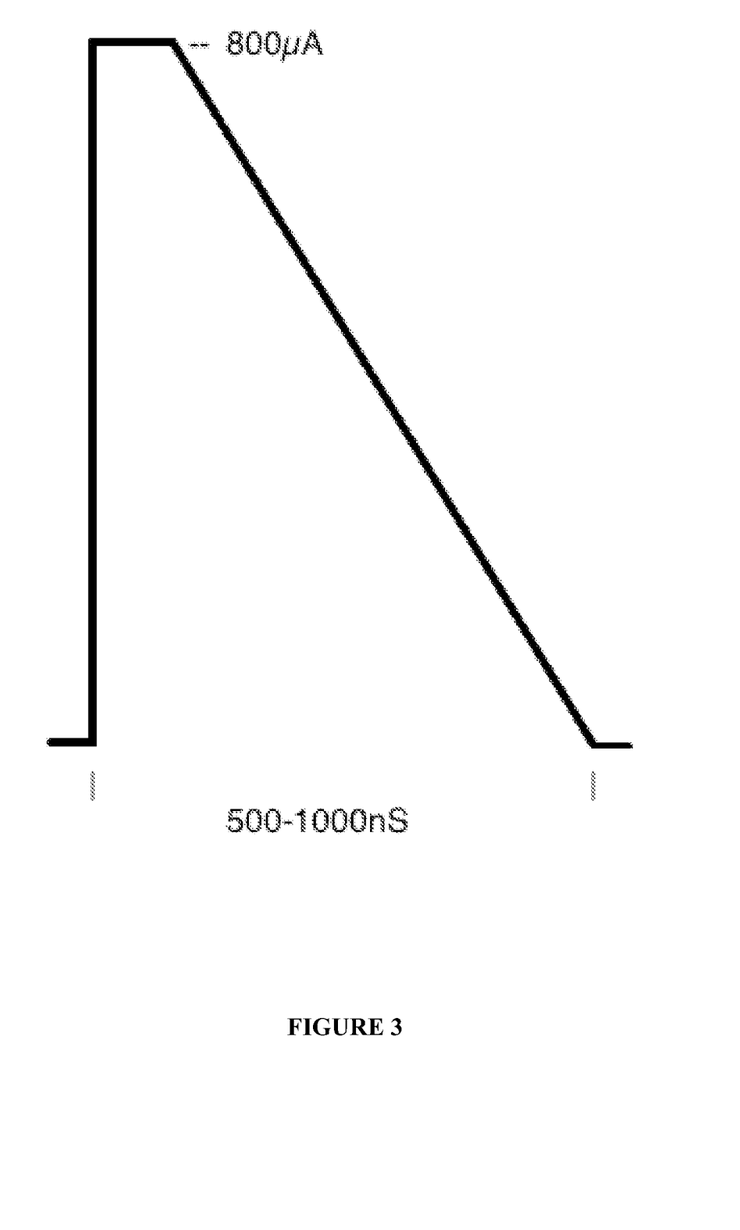
FIG. 3 illustrates a plot of current (on the -axis) over time (y-axis) for setting both bits of a dual-bit memory element according to the present invention.

FIG. 3 depicts a current pulse for setting both bits of a dual-bit memory element according to the present invention. The high amplitude will melt both storage elements. The slow ramping trailing edge will cause the upper element (GST-172) to be annealed into its crystalline state as the amplitude ramps through the approximately 100 µA level whereas the lower element will still be in its melted state. As the ramp continues downward through 90 µA and down to 0 A, the lower element will then also be annealed into its crystalline state.

Figure 4:
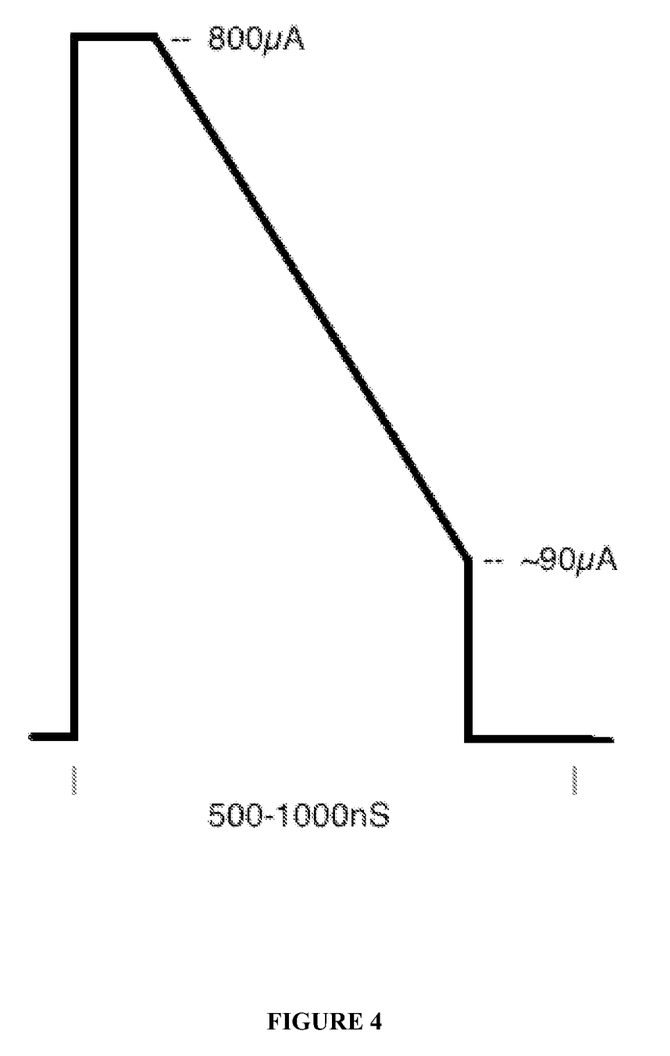
FIG. 4 illustrates a plot of current (on the y-axis) over time (y-axis) for setting the upper bit and resetting the lower bit of a dual-bit memory element according to the present invention.

FIG. 4 depicts a current pulse for setting the upper bit and resetting the lower bit of a dual-bit memory element according to the present invention. The high initial amplitude will melt both storage elements. The slow ramping trailing edge will cause the upper element (GST-172) to be annealed into its crystalline state as the amplitude ramps through the approximately 100 µA level whereas the lower element will still be in its melted state. However, from this point, the current is quickly quenched and this rapid cutoff will quench the bottom bit into its amorphous state.

Figure 5:
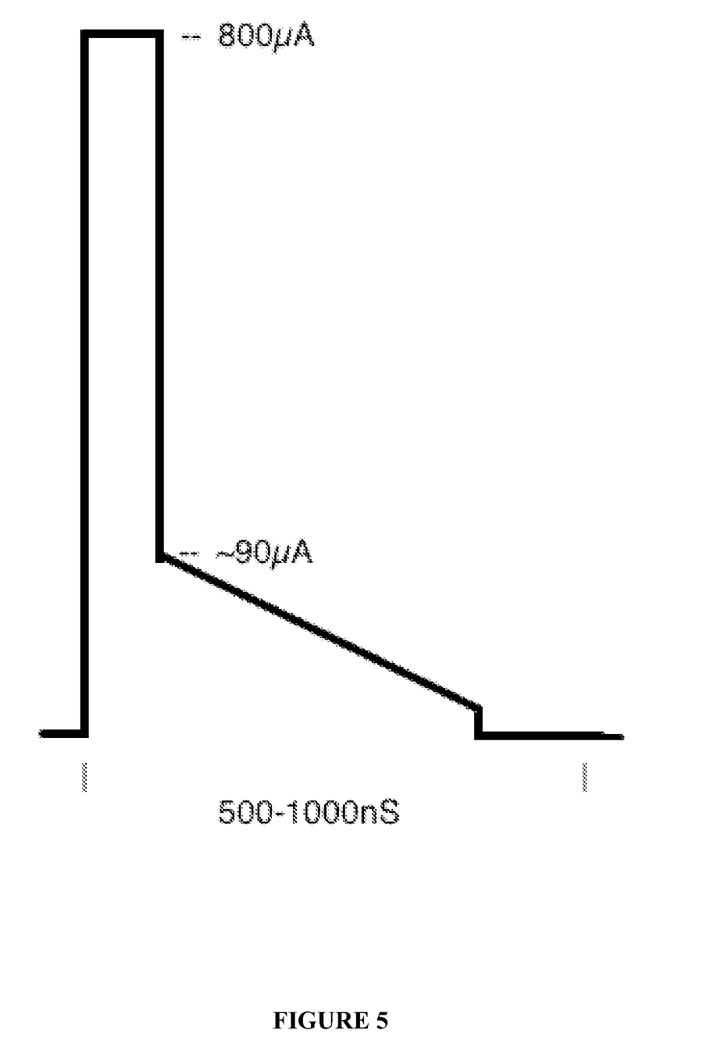
FIG. 5 illustrates a plot of current (on the y-axis) over time (y-axis) for resetting the upper bit and setting the lower bit of a dual-bit memory element according to the present invention.

FIG. 5 depicts a current pulse for resetting the upper bit and setting the lower bit of a dual-bit memory element according to the present invention. The high initial amplitude will melt both storage elements. The rapidly dropping trailing edge will cause the upper element (GST-172) to be trapped in its amorphous state (as the pulse drops quickly to 10% to 20% of the initial value) while the lower element will still be in its melted state. However, from this point, as the ramp continues downward from 90 µA and down to 0 A, the lower element will then be annealed into its crystalline state.

Memory cells having been programmed with more than a single binary bit will typically fail by taking on the level of an adjacent state. This can occur because the level being stored is not stored to exactly the correct value. This can result from temperature variations, voltage fluctuations, poor circuit design or many other causes while programming. This can also result after correctly programming a cell due to the physics of the storage element; for example, phase change storage elements tend to drift towards becoming more crystalline over time (because the atomic structure of the phase-change material spontaneously evolves towards thermodynamic equilibrium, which is the state of maximum entropy). Charged floating gates such as those in Flash memory cells, even if initially programmed correctly, will occasionally lose an electron from the floating gate and consequently, will drift in the direction of the fully discharged state. One solution to this problem is to program fewer levels in a given storage element. For example, a single middle level could be added to a cell otherwise only having a set and a reset state. Such an approach combined with the present two element invention would result in a memory cell having three bits of storage. The programming of a middle level can be accomplished by altering the point at which the trailing edge transitions from a slow ramp to a final fast quench. Referring to FIG. 4, if the current were quickly reduced to about 100 µA from the point in the middle of the ramping portion, the upper element would be partially annealed (i.e., to an intermediate level) while the lower bit would still be in its melted state. The bottom bit could then be likewise placed into an intermediate state by quenching the current from near the middle of its ramp (as depicted in FIG. 5).

Reading the memory cell is accomplished by applying a low voltage (typically less than 0.4 volts) and reading the current through the cell to determine the combined series resistance of the two elements. For example the lower element made of GST-433 could have a set resistance in the vicinity of 40kΩ whereas it could have a reset resistance of about 1 MΩ. The upper element made of GST-172 could have a set resistance in the vicinity of 200kΩ whereas it could have a reset resistance of about 2 MΩ (to insure this different range of resistances, either the element's length through the neck of the cell's hourglass shaped spacer can be increased or reduced to achieve a discernable difference in resistance values between the two elements). In this example, a resistance of 3 Mω would correspond to both bits being reset, a resistance of 2.04 MΩ would correspond to the lower bit being set and the upper bit being reset, a resistance of 1.2 MΩ would correspond to the lower bit being reset and the upper bit being set, and a resistance of 240kΩ would correspond to both bits being set.

Figure 6:
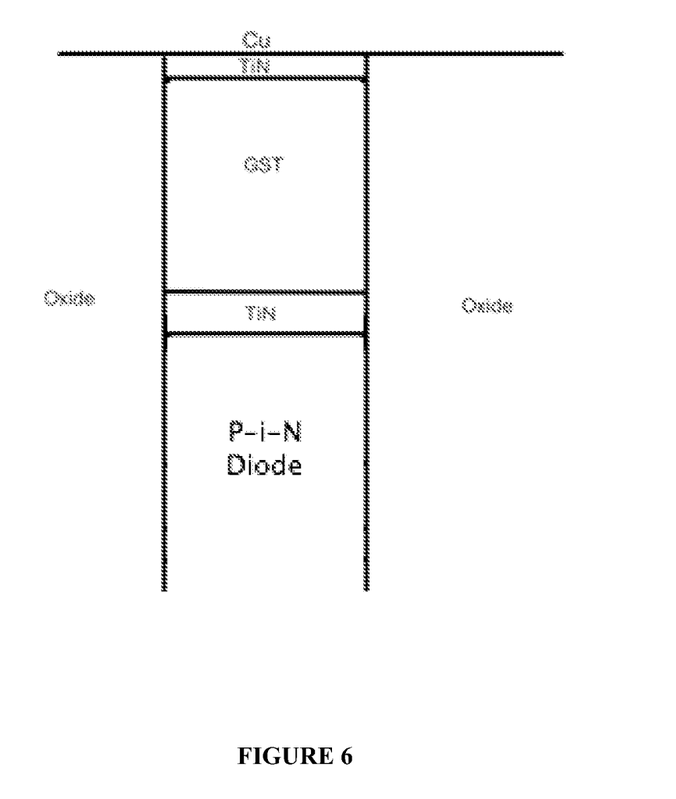
FIG. 6 illustrates a memory cell having a single memory element highlighting the self-aligned bottom contact.

The memory elements shown herein in a stacked form within a hole or cup-like opening above the diode whereby the hole is filled with barrier and/or adhesion material (such as Ti or TiN but which could be an alternate material such as TaN) which is deposited into the hole and then etched back (as was done to form the bottom conductor for a good electrical contact); this leaves a small layer of this barrier material in the bottom of the hole which is self-aligned in the structure. A memory element such as GST (but could be other material or types of information storage elements) is then deposited into the hole above the barrier and/or adhesion material. The structure can include a spacer at the bottom of the hole, the hourglass spacer described above, or no spacer. FIG. 6 depicts a single layer memory cell element in which the barrier and/or adhesion material (lower TiN) has been deposited below the memory element (GST). In practice, the barrier and/or adhesion material would be deposited to fill the hole and then this barrier and/or adhesion material would be etched back using a timed etch in order to leave a desired amount of the batter and/or adhesion material in the bottom of the hole. Deposition techniques for filling a high aspect ratio hole are known to those skilled in the art as are etch techniques for selectively removing one material more quickly than another. As an example of the present invention, the surrounding material is $SiO_2$ and the barrier and/or adhesion material to be put at the bottom of the hole is TiN with a Titanium Salicide (self-aligned Titanium Silicide—TiSix) layer underneath the TiN. A thin layer of thin Ti (6 nm @680 C) is deposited first and can be done separately using PVD sputtering at room temp, then CVD TiN (64 nm, 680 C, precursor is Titanium Chloride—TiCl4) which is enough to fill the hole. The deposition temperature is high enough to form the Ti Salicide layer. The purpose of this Salicide is to provide current spreading on the diode. This makes sure the current is spread across the entire diode surface to keep the current density at any one point from becoming too great as will be well understood by those skilled in the art. The TiN has a dual purpose of providing a chemical barrier between the Salicide and GST while also being a thermally resistive metal that reduces heat loss to the Silicide and Silicon diode.

Following deposition of the barrier and/or adhesion and/or conductive material, a Titanium Nitride etchback is performed by inductively coupled plasma etching using a Chlorine-containing etchant gas such as $Cl_2$ with high selectivity to Silicon Dioxide. The resulting shape is a very short cylinder of TiN in the bottom of the hole without requiring the use of photolithography. Following the etchback of the barrier and/or adhesion and/or conductive material, the information storage material (e.g., such as a Calcogenide alloy such as GST) is deposited and etched back, and following this deposition and etchback of the information storage material, a top contact (e.g., a barrier and/or adhesion and/or conductive material such as TiN) can be formed through deposition and, typically, finished with a CMP step (or could be an etchback step).

Memory devices incorporating embodiments of the present invention may be applied to memory devices and systems for storing digital text, digital books, digital music (such as MP3 players and cellular telephones), digital audio, digital photographs (wherein one or more digital still images can be stored including sequences of digital images), digital video (such as personal entertainment devices), digital cartography (wherein one or more digital maps can be stored, such as GPS devices), and any other digital or digitized information as well as any combinations thereof.

Devices incorporating embodiments of the present invention may be embedded or removable, and may be interchangeable among other devices that can access the data therein. Embodiments of the invention may be packaged in any variety of industry-standard form factor, including compact flash, secure digital, multimedia cards, PCMCIA cards, memory stick, any of a large variety of integrated circuit packages including ball-grid arrays, dual in-line packages (DIPs), SOICs, PLCCs, TQFPs, and the like, as well as in proprietary form factors and custom designed packages. These packages can contain just the memory chip, multiple memory chips, one or more memory chips along with other logic devices or other storage devices such as PLD's, PLA's, micro-controllers, microprocessors, controller chips or chipsets or other custom or standard circuitry.

Systems incorporating memory devices comprising embodiments of the present invention have the advantages of high density, non-volatile memory. Such systems could provide long term storage as a solid state storage device instead of or in addition to rotating media storage (e.g., magnetic disks, read only or read/write optical disks, and the like) and/or network based storage. Such systems could be in the form of a desk-top computer system, a hand-held device (such as a tablet computer or a laptop computer), a communication device (such as a cell phone, a smart phone, a portable wirelessly networked device for music, video or other purposes, or the like), and/or any other system based device having data storage.

The foregoing description of an example of embodiments of the present invention; variations thereon have been presented for the purposes of illustration and description. It is not intended to be exhaustive or to limit the invention to the precise forms disclosed. Many modifications and variations are possible in light of the above teaching. It is intended that the scope of the invention be limited not by this detailed description.

Certain embodiments of the present invention were described above. It is, however, expressly noted that the present invention is not limited to those embodiments, but rather the intention is that additions and modifications to what was expressly described herein are also included within the scope of the invention. Moreover, it is to be understood that the features of the various embodiments described herein were not mutually exclusive and can exist in various combinations and permutations, even if such combinations or permutations were not made express herein, without departing from the spirit and scope of the invention. In fact, variations, modifications, and other implementations of what was described herein will occur to those of ordinary skill in the art without departing from the spirit and scope of the invention. As such, the invention is not to be defined only by the preceding illustrative description.

What is claimed is:

1. A method of making a memory cell, comprising:
   depositing a layer of dielectric material on a surface;
   etching a hole through the dielectric material;
   filling the hole with first conductive material;
   etching the first conductive material to remove a portion of the first conductive material from the hole;
   depositing a layer of barrier or adhesion or second conductive material on remaining first conductive material in the hole;

etching the layer of barrier or adhesion or second conductive material in the hole to remove a portion of the second conductive material from the hole;

depositing information storage material into the hole onto remaining barrier or adhesion or second conductive material; and removing a portion of the information storage material.

2. The method of claim 1, wherein the removing a portion of the information storage material comprises etching.

3. The method of claim 1, wherein the removing a portion of the information storage material comprises CMP.

4. The method of claim 1, wherein the information storage material comprises phase change material.

5. The method of claim 4, wherein the phase change material comprises Chalcogenide elements.

6. The method of claim 1, wherein the first conductive material comprises tungsten.

7. The method of claim 1, wherein the dielectric material comprises $SiO_2$.

8. The method of claim 1, wherein the barrier or adhesion or second conductive material comprises a layer of titanium salicide and a layer of TiN.

9. The method of claim 8, wherein the titanium salicide is disposed on the remaining first conductive material.

10. The method of claim 1, further comprising:

depositing a between-element barrier material over remaining information storage material in the hole;

removing a portion of the between-element barrier material from the hole;

depositing top information storage material in the hole over remaining between-element barrier material;

removing a portion of the top information storage material from the hole;

depositing a top contact over remaining top information storage material in the hole;

removing a portion of the top contact; and depositing a top dielectric layer over remaining top contact.

11. The method of claim 10, wherein the top contact comprises TiN.

12. The method of claim 10, wherein the between-element barrier material comprises TiN.

13. The method of claim 10, wherein removing a portion of the top contact comprises etching.

14. The method of claim 10, wherein removing a portion of the top contact comprises CMP.

15. The method of claim 10, wherein the information storage material and the top information storage material have different melting points.

16. The method of claim 15, wherein the top information storage material has a higher melting point than the information storage material.

17. The method of claim 16, wherein the information storage material and the top information storage material comprises Chalcogenide elements.

18. A method for forming a barrier and/or adhesion surface below an information storage element comprising the steps: (i) in a dielectric material, forming a cup into which an information storage element is to be formed, (ii) filling the cup with the barrier and/or adhesion and/or conducive material, (iii) etching the barrier and/or adhesion and/or conductive material with an etch that selectively removes the barrier and/or adhesion and/or conductive material at a faster rate than the surrounding dielectric material, (iv) stopping the etch before removing all of the barrier and/or adhesion and/or conductive material in the cup, and (v) filling at least a portion of the area of the cup from which the barrier and/or adhesion and/or conductive material was etched with an information storage material.

19. The method of claim 18 whereby the information storage material comprises GST.

20. The method of claim 18 further comprising (vi) etching the information storage material with an etch that selectively removes the information storage material at a faster rate than the surrounding dielectric material, (vii) stopping the etch before removing all of the information storage material in the cup, and (viii) filling at least a portion of the area of the cup from which the information storage material was etched with a barrier and/or adhesion and/or conductive material.

* * * * *

UNITED STATES PATENT AND TRADEMARK OFFICE
CERTIFICATE OF CORRECTION

PATENT NO. : 9,450,182 B2  
APPLICATION NO. : 14/794762  
DATED : September 20, 2016  
INVENTOR(S) : Mac D. Apodaca and Daniel Robert Shepard Page 1 of 1

It is certified that error appears in the above-identified patent and that said Letters Patent is hereby corrected as shown below:

In the Specification

Column 4, Line 66, please delete "3 M$\omega$" and insert --3 M$\Omega$--

Column 5, Line 54, please delete "Calcogenide" and insert --Chalcogenide--

Signed and Sealed this
Third Day of January, 2017

Michelle K. Lee
*Director of the United States Patent and Trademark Office*